United States Patent
Ikeda et al.

(10) Patent No.: US 6,190,104 B1
(45) Date of Patent: Feb. 20, 2001

(54) TREATMENT OBJECT CONVEYOR APPARATUS, SEMICONDUCTOR MANUFACTURING APPARATUS, AND TREATMENT OBJECT TREATMENT METHOD

(75) Inventors: Kazuhito Ikeda; Shinichiro Watahiki; Hisashi Yoshida; Yukinori Aburatani, all of Tokyo (JP)

(73) Assignee: Kokusai Electric Co., Ltd., Tokyo (JP)

( * ) Notice: Under 35 U.S.C. 154(b), the term of this patent shall be extended for 0 days.

(21) Appl. No.: 09/326,673

(22) Filed: Jun. 7, 1999

(30) Foreign Application Priority Data

Jun. 8, 1998 (JP) .................................................. 10-159117
May 26, 1999 (JP) .................................................. 11-146579

(51) Int. Cl.⁷ .................................................. B65G 49/07
(52) U.S. Cl. .......................................... 414/217; 414/939
(58) Field of Search ..................................... 414/217, 939

(56) References Cited

U.S. PATENT DOCUMENTS 5,009,738 * 4/1991 Gruenwald et al. .................. 156/345
5,121,705 * 6/1992 Sugino .................................. 118/719
5,643,366 * 7/1997 Somekh et al. ....................... 118/721

FOREIGN PATENT DOCUMENTS 5-318350   12/1993   (JP) .

* cited by examiner

Primary Examiner—Steven A. Bratlie
(74) Attorney, Agent, or Firm—Oliff & Berridge PLC.

(57) ABSTRACT

A method and apparatus for conveying a treatment object whereby a drive unit for driving a treatment object conveyor robot is deployed inside a vacuum chamber. The robot comprises a conveyor arm and a drive unit. The conveyor arm is accommodated outside an airtight vessel and the drive unit is accommodated inside the airtight vessel to avoid damage to the drive unit. In order to raise and lower the robot inside the chamber, an elevator mechanism, deployed outside the chamber, advances and retracts a shaft that is inserted in an airtight manner into the chamber. The airtight structure is secured by O rings provided where a bellows surrounds the shaft and connects to the chamber and the elevator mechanism. The shaft, inserted inside the chamber, is linked to the airtight vessel that accommodates the drive unit of the robot. The airtight vessel communicates to the outside via a hollow portion in the shaft and the interior thereof is always kept at atmospheric pressure.

9 Claims, 8 Drawing Sheets

TREATMENT OBJECT CONVEYOR APPARATUS, SEMICONDUCTOR MANUFACTURING APPARATUS, AND TREATMENT OBJECT TREATMENT METHOD

BACKGROUND OF THE INVENTION

1. Field of the Invention

This invention relates to a treatment object conveyor apparatus for conveying objects to be treated inside a chamber, a semiconductor manufacturing apparatus comprising the treatment object conveyor apparatus, and a treatment object treatment method that uses the semiconductor manufacturing apparatus.

2. Description of the Related Art

In FIG. 8A–FIG. 8D are diagrammed a treatment object conveyor apparatus for conveying objects to be treated, which configures a main component of a conventional semiconductor manufacturing apparatus. A vacuum chamber comprises an upright vacuum chamber 1, and, above and below, two connecting chambers 2 and 3 that are connected laterally, so that a treatment object 4 such as a semiconductor wafer or a wafer cassette for holding semiconductor wafers can be conveyed between the vacuum chamber 1 and the connecting chambers 2 and 3. FIG. 8A is a front elevation diagramming how conveying is done in the horizontal direction indicated by arrow B between the vacuum chamber 1 and the upper connecting chamber 2. FIG. 8B is a side elevation of FIG. 8A. FIG. 8C is a front elevation diagramming how conveying is done in the vertical direction indicated by arrow A inside the vacuum chamber 1. And FIG. 8D is a front elevation diagramming how conveying is done in the horizontal direction indicated by arrow B between the vacuum chamber 1 and the lower connecting chamber 3.

An elevator mechanism 16 that raises and lowers a treatment object conveyor robot 12 is deployed inside the vacuum chamber 1. To describe the configuration of this elevator mechanism 16, a straight guide shaft 7 and a threaded shaft 6 are deployed upright between two elevator attachment bases 5 and 6 located at the top and bottom inside the vacuum chamber 1. To the threaded shaft 8 is attached an elevator pedestal 9 that ascends and descends along the guide shaft 7. For this reason, a threaded hole that engages the threaded shaft 8 and a guide hole in which the guide shaft 7 can slide are provided in the elevator pedestal 9. By engaging the elevator pedestal 9 with the threaded shaft 8 and turning the threaded shaft 8, the elevator pedestal 9 is made to ascend and descend along the guide shaft 7. A motor 10 that is designed for operation in air and that is the drive source for turning the threaded shaft 8 is provided in the atmosphere outside the vacuum chamber 1. This is because motors designed for use in a vacuum are expensive. The turning shaft of the motor 10 penetrates to the inside of the vacuum chamber 1 via a magnetic seal 11, and is linked to the threaded shaft 8 through the elevator attachment base 5, so that the turning thereof is transmitted to the threaded shaft 8.

With only the elevator pedestal 9, the treatment object 4 can only be made to ascend and descend in the vertical direction (arrow A), wherefore the elevator pedestal 9 is linked to a treatment object conveyor robot 12 to achieve complex movements of the treatment object 4 that include movements in the horizontal direction (arrow B). The treatment object conveyor robot 12 comprises a conveyor arm 13 and a drive unit 14 comprising a motor. The conveyor arm 13 is turned or extended and retracted by the drive unit 14 to convey the wafer-holding wafer cassette or other treatment object 4 in the horizontal direction.

Unless the entire treatment object conveyor robot 12 is made to ascend and descend, it is possible to place the drive unit for the treatment object conveyor robot 12 outside of the vacuum chamber 1. However, in order to cause the entire treatment object conveyor robot 12 to ascend and descend, the drive unit 14 is accommodated inside an airtight vessel 15 from which communication with the outside has been cut off, thus preventing dust generated in conjunction with the movement of the drive unit 14 from being scattered inside the vacuum chamber 1. For the same reason as that stated earlier, designing the drive unit 14 to operate in a vacuum results in high cost, wherefore an inexpensive drive unit designed for use in air is used, with the interior of the airtight vessel 15 normally at atmospheric pressure.

The treatment object conveyor apparatus described in the foregoing is subject, however, to the following problems.

(1) The elevator mechanism comprising such sliding parts as the guide shaft 7, threaded shaft 8, and elevator pedestal 9, etc., is deployed inside the vacuum chamber 1, wherefore particles and the like are produced by the sliding parts and not only constitute a danger of contaminating the clean environment inside the vacuum chamber 1 but also result in a larger vacuum chamber 1 because the elevator mechanism 16 is inside the vacuum chamber 1.

(2) The drive unit 14 inside the airtight vessel 15 linked to the elevator pedestal 9 is designed for operation in air, wherefore, if a leak develops in the airtight vessel 15 so that the interior thereof becomes a vacuum as inside the vacuum chamber 1, there is a danger that the drive unit 14 which is designed for operation in air will be damaged so that stable operation cannot be obtained. In order to prevent this, the drive unit 14 must be designed to operate in a vacuum, which makes it expensive.

SUMMARY OF THE INVENTION

An object of the present invention is to provide a treatment object conveyor apparatus, a semiconductor manufacturing apparatus, and a treatment object treatment method wherewith it is possible to stably operate the treatment object conveyor means deployed inside a chamber, and wherewith the problems in the prior art noted above are resolved. Another object of the present invention is to provide a treatment object conveyor apparatus, a semiconductor manufacturing apparatus, and a treatment object treatment method wherewith the generation of dust inside the chamber can be reduced and the chamber can be made smaller.

A first invention is a treatment object conveyor apparatus comprising: a chamber; a treatment object conveyor means deployed inside the chamber having a conveyor unit and a drive unit for driving the conveyor unit, for driving the conveyor unit with the drive unit and for conveying the treatment object carried by the conveyor unit; an airtight vessel for housing the drive unit of the treatment object conveyor means in an airtight condition inside the chamber; a shaft that penetrates in an airtight way into the chamber from outside the chamber and which is linked with the airtight vessel for advancing and retracting the airtight vessel relative to the chamber to move the entirety of the treatment object conveyor means; a movement mechanism for advancing and retracting the shaft; and a venting channel that effects the outside atmosphere inside the airtight vessel by causing the airtight vessel to communicate with the outside of the chamber. The pressure inside the chamber may be a vacuum, atmospheric pressure, or some other pressure.

When the movement mechanism deployed outside the chamber is moved, the airtight vessel accommodated inside the chamber is moved via the shaft, wherefore the entirety of the treatment object conveyor means attached to the airtight vessel also moves. The drive unit inside the airtight vessel can be moved in the outside atmosphere because the airtight vessel communicates to the outside. When the drive unit is moved, the treatment object conveyor means themselves move, and the treatment object carried on the conveyor unit is conveyed to another location inside the chamber, or to a connecting chamber connected to the chamber.

Of the components of the treatment object conveyor means deployed inside the chamber, the conveyor unit is exposed inside the chamber, but the drive unit is configured so that it is contained in an airtight condition in the airtight vessel that communicates with the outside. That being so, even when the treatment object conveyor means are operated inside the chamber, unlike the conveyor unit that is exposed to the chamber atmosphere, the drive unit is not exposed to the chamber atmosphere. Also, the airtight vessel communicates with the outside, wherefore, even should the airtightness of the airtight vessel fail, the interior of the chamber will merely become the outside atmosphere, and no change will occur in the atmosphere inside the airtight vessel, so that the drive unit will not malfunction because of the airtightness failure.

Furthermore, because the movement mechanism is deployed outside the chamber, the dust produced during the movement of the movement mechanism is not produced inside the chamber, and the cleanness of the chamber is improved. Also, because there is no need to accommodate the movement mechanism inside the chamber, the chamber can be made smaller, and the cost of the apparatus reduced.

A second invention is the treatment object conveyor apparatus according to the first invention, wherein the venting channel comprises a supply/exhaust channel for supplying and exhausting an inert gas, atmospheric air, or a mixture of such gases from outside the chamber to and from the airtight vessel.

Instead of simply introducing the outside atmosphere into the airtight vessel, a supply/discharge channel is actively deployed in the venting channel, so that, if an inert or inactive gas such as nitrogen, helium, or argon, or atmospheric air, or a mixture of such gases is supplied to the interior of the airtight vessel, the motor, etc., of the drive unit configuring the treatment object conveyor means accommodated inside the vacuum vessel can be cooled, and the useful life of the drive unit extended. Also, the gas supplied to the interior of the airtight vessel is exhausted after circulating inside the airtight vessel, wherefore contaminating substances generated by the drive unit can be removed from the interior of the airtight vessel. Therefore, even should the airtightness of the airtight vessel fail, the volume of contamination entering the chamber can be reduced.

A third invention is the treatment object conveyor apparatus according to the second invention, wherein electrical wiring is passed to the drive unit accommodated inside the airtight vessel from outside the chamber through the venting channel provided in the shaft. Thus by implementing a simple structure that uses the venting channel provided in the shaft, it is possible to connect the necessary signal lines and power supply lines, etc., to the drive unit.

A fourth invention is the treatment object conveyor apparatus according to the first to third inventions, wherein the shaft is covered by a bellows, the starting end of the bellows is secured to the chamber by sealing means such as an O ring, the terminal end of the bellows is secured to the movement mechanism by sealing means such as an O ring, and the chamber into which the shaft is inserted is made an airtight structure. The seals between the shaft and the chamber, and between the shaft and the movement mechanism, can be secured easily and at low cost by sealing means comprising an O ring or the like, and the sealing of the shaft with respect to movement in the axial direction can be secured easily and at low cost by the bellows. Instead of O rings, the sealing means may be Teflon rings or elastomer gaskets.

A fifth invention is the treatment object conveyor apparatus according to the first to fourth inventions, wherein the treatment object is a semiconductor wafer, a glass substrate, or a cassette for accommodating such. The treatment object conveyor means in this invention is particularly suitable for use when the treatment object is a semiconductor wafer, a glass substrate, or a cassette for accommodating such.

In a sixth invention, the drive unit is accommodated inside the airtight vessel that communicates with the outside, and the drive unit does not need to be designed for operation in a vacuum, even if the treatment object conveyor means are operated inside the vacuum chamber. Also, because the airtight vessel in this embodiment communicates with the outside, even if the airtightness of the airtight vessel fails, all that will happen is that the interior of the chamber will become the outside atmosphere, and the airtight vessel will continue unaltered with the outside atmosphere intact, wherefore this will not cause drive unit malfunction.

In a seventh invention, the interior of the chamber in the first to the fifth inventions is put at atmospheric pressure. When the pressure inside the chamber is made atmospheric pressure, the interior of the chamber will not be contaminated by dust generated by the drive unit, the drive unit can be cooled by connecting it to the outside air, and, if an inert or inactive gas is supplied, the drive unit cooling effectiveness will be improved.

An eighth invention is a semiconductor manufacturing apparatus comprising the treatment object conveyor apparatus of the first to the seventh inventions. By building the treatment object conveyor apparatus described in the foregoing into a semiconductor manufacturing apparatus, a more highly reliable semiconductor manufacturing apparatus is obtained.

A ninth invention uses a semiconductor manufacturing apparatus comprising a chamber; a treatment subchamber for treating treatment objects that is linked in an airtight manner to the chamber; a treatment object conveyor means, deployed inside the chamber, comprising an arm unit and a drive unit for driving the arm unit, which drives the arm unit with the drive unit and conveys the treatment object carried by the arm unit; an airtight vessel for accommodating the drive unit of the treatment object conveyor means in an airtight manner inside the chamber; a venting channel that allows the airtight vessel to communicate with the outside of the chamber; and a shaft that penetrates in an airtight manner into the chamber from outside the chamber and which is linked with the airtight vessel for advancing and retracting the airtight vessel relatively with the chamber to move the treatment object conveyor means inside the chamber.

Further provided and disclosed is a treatment object treatment method wherein, having introduced the outside atmosphere into the airtight vessel through the venting channel, the shaft is advanced and retracted to integrally move the treatment object conveyor means to positions corresponding to the treatment subchamber inside the chamber, after which the arm unit of the treatment object conveyor means is moped by the drive unit accommodated inside the airtight vessel, the treatment object carried by the arm unit is conveyed from the chamber to the treatment subchamber, the treatment object conveyed to the treatment subchamber is loaded on a treatment object carrier unit inside the treatment subchamber, and the treatment object loaded on the treatment object carrier unit is subjected to a prescribed treatment.

The airtight vessel is made to communicate with the outside, wherefore, when a vacuum exists in the chamber, the airtight vessel merely becomes the outside atmosphere, making it unnecessary to design the drive unit for operation in a vacuum. The drive unit will not be damaged by a failure of airtightness in the airtight vessel, so the process of treating the treatment object need not be suspended midway, wherefore the treatment object production cost can be reduced. Also, when an airtightness failure does occur in the airtight vessel, maintenance may be done at a time other than during a treatment process. Furthermore, whether the chamber is made a vacuum or kept at atmospheric pressure, the drive unit is accommodated in the airtight vessel, wherefore the interior of the chamber is not contaminated by dust, and the treatment object being treated can be maintained in a clean state. Furthermore, whether the chamber is made a vacuum or kept at atmospheric pressure, the airtight vessel communicates with the outside of the chamber, wherefore the drive unit is cooled so that its useful life is extended, long-term operation of the treatment object conveyor means is facilitated, the frequency of stopping the processing of treating the treatment object midway is reduced, and the cost of producing the treatment object can be reduced.

DESCRIPTION OF THE PREFERRED EMBODIMENTS

Embodiments of the treatment object conveyor apparatus, semiconductor manufacturing apparatus, and treatment object treatment method of the present invention are now described.

Figure 1:
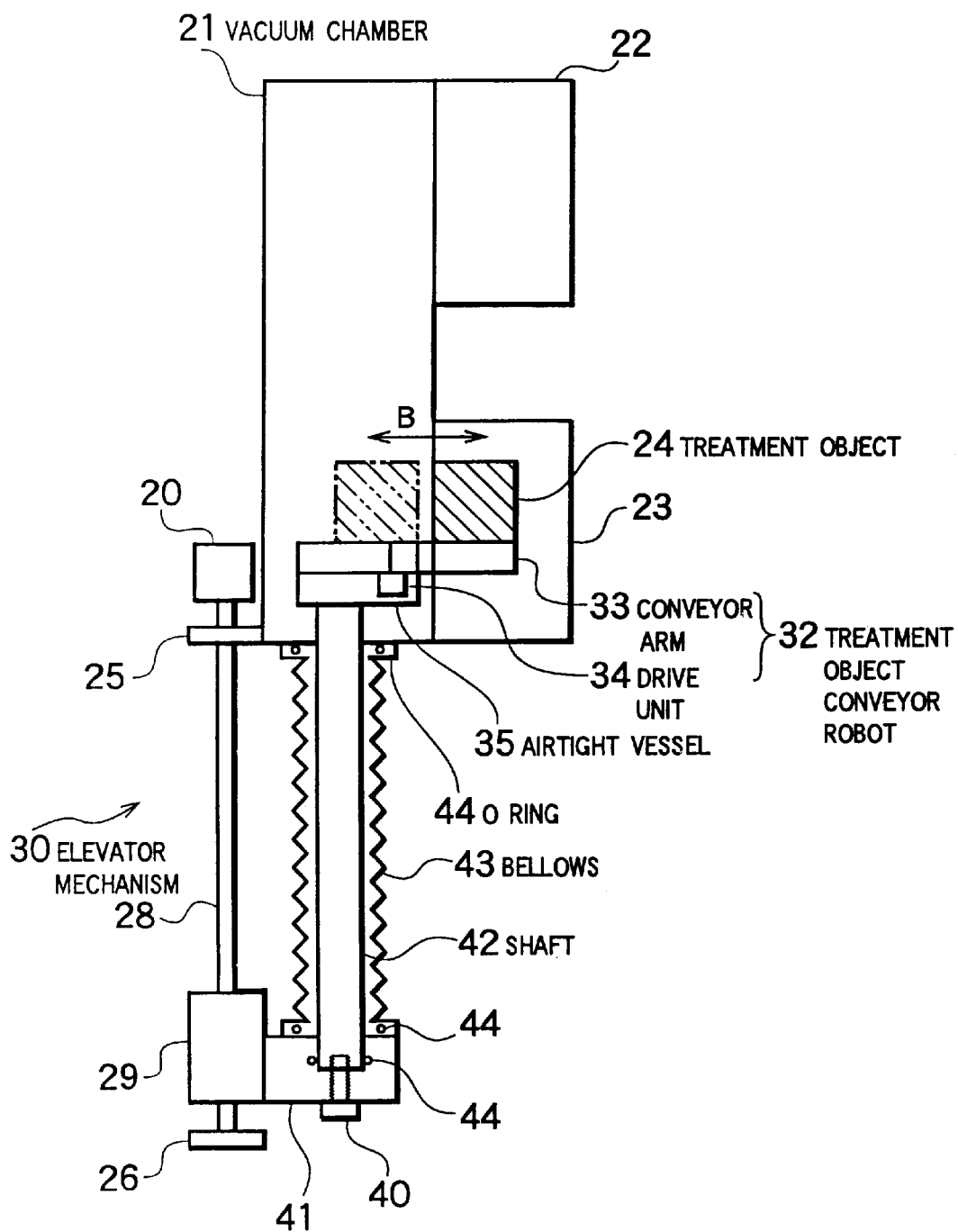
FIG. 1 is a simplified configurational diagram of a treatment object conveyor apparatus according to a first embodiment.

In FIG. 1 is diagrammed a first embodiment wherein an elevator mechanism 30 is deployed outside a vacuum chamber 21 as a movement mechanism. A treatment object conveyor robot 32 is deployed inside the vacuum chamber 21 for handling a treatment object 24 such as a substrate or wafer cassette. Connecting chambers 22 and 23 are connected laterally, above and below, to the vacuum chamber 21, so that the treatment object 24 can be conveyed by the treatment object conveyor robot 32 between the vacuum chamber 21 and the connecting chambers 22 and 23. Elevator attachment bases 25 and 26, a guide shaft (not shown), a threaded shaft 28, and an elevator pedestal 29 attached thereto, which configure the elevator mechanism 30 that raises and lowers the treatment object conveyor robot 32, are located outside the vacuum chamber 21 in the same manner as a motor 20 for turning the threaded shaft.

The treatment object conveyor robot 32 comprises a conveyor arm 33 for conveying the treatment object 24 and a drive unit 34 for driving the conveyor arm 33. The drive unit 34 is accommodated inside an airtight vessel 35. This treatment object conveyor robot 32 and a support member 41 attached to the elevator pedestal 29 are linked by a shaft 42 that penetrates inside the vacuum chamber 21 so that it can be freely advanced and retracted, and the ascending and descending movement of the elevator pedestal 29 resulting from the turning of the threaded shaft 29 linked to the motor 20 is transmitted to the treatment object conveyor robot 32 inside the vacuum chamber 21. The shaft 42 is made airtight with respect to the vacuum chamber 21. This airtightness is secured by sealing means such as O rings 44 and a bellows 43. The bellows 43 surrounds the shaft 42. The upper end thereof is attached via one O ring 44 to the vacuum chamber 21, while the lower end thereof is attached to the support member 41 for the elevator pedestal 29 via another O ring 44. An O ring 44 is also provided at the connection between the shaft 42 and the support member 41.

The shaft 42 and support member 41 are linked by a bolt 40 to prevent the shaft 42 from toppling over. Alternatively it may be connected by welding. In that case, the O ring 44 placed between the support member 41 and the shaft 42 to preserve airtightness becomes unnecessary. Stainless steel is used for the material of the bellows 43 in the interest of high pressure resistance and high heat resistance.

When the configuration is as described in the foregoing, the sliding parts such as the guide shaft, threaded shaft 28, and elevator pedestal 29 are not located inside the vacuum chamber 21, wherefore particles and the like caused by the sliding parts are not produced, and the clean environment inside the vacuum chamber 21 can be preserved. Also, because the elevator mechanism 30 is outside the chamber 21, the vacuum chamber 21 can be made smaller.

The treatment object conveyor robot 32 deployed inside the vacuum chamber 21 must have electrical wiring led into the vacuum chamber 21 from the outside and connected to the drive unit 34 in order to drive and control the conveyor arm 33. This wiring is led in by providing an airtight wiring access port in the vacuum chamber 21. When this is done, however, the structure becomes complex. Therefore, as in the embodiment diagrammed in FIG. 2, the shaft 42 is given a hollow structure, the power lines, signal lines, and sensor lines (not shown), etc., necessary for controlling the drive unit 34 are led through a hollow portion 45 that serves as the venting channel, and the drive unit 34 is thus connected to external equipment, etc. The sensor lines are electrical wires that connect to sensors such as a treatment object detection sensor.

In the first and second embodiments described in the foregoing, a bellows 43 is used for securing the airtightness of the shaft 42 with respect to its movement in the axial direction. However, as in a third embodiment, diagrammed in FIG. 3, instead of using a bellows, a toppling-prevention guide 47, such as a threaded spline that allows movement in the axial direction but restricts movement in directions around the shaft, may be attached in an airtight manner at the place where the shaft penetrates into the vacuum chamber 21, a spline shaft passed through an insertion hole in the toppling-prevention guide 47, and an O ring 46 set between the toppling-prevention guide 47 and the spline shaft 62, and the airtightness relative to movement in the axial direction of the spline shaft 62 thus secured. When the airtight vessel is configured in this manner, with the toppling-prevention guide 47 and O ring 46, airtightness can be secured with a simple structure that does not require a bellows, whereupon the treatment object conveyor robot 12 can ascend and descend smoothly.

Figure 2:
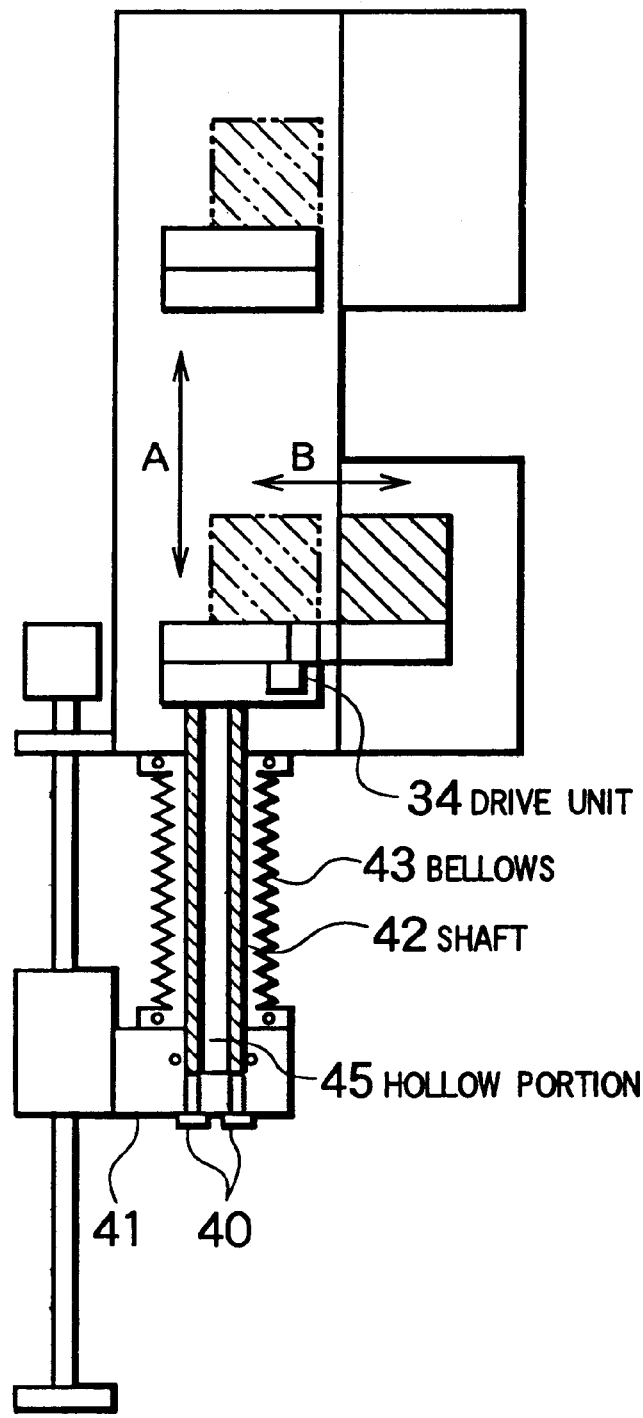
FIG. 2 is a simplified configurational diagram of a treatment object conveyor apparatus according to a second embodiment.
Figure 3:
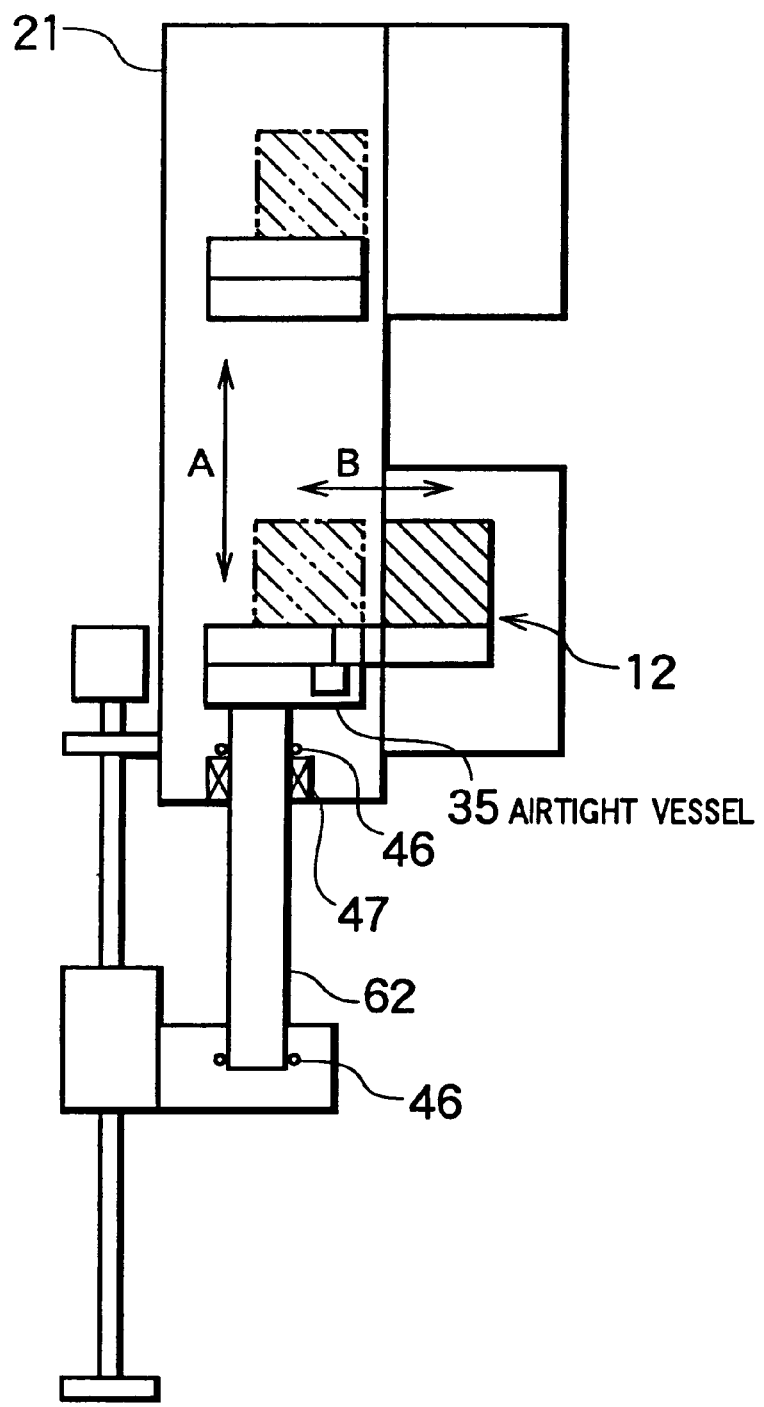
FIG. 3 is a simplified configurational diagram of a treatment object conveyor apparatus according to a third embodiment.

The support of the shaft 42 for the vacuum chamber 21 is non-contact support as diagrammed in FIG. 1 and FIG. 2, but is contact-supported by the spline shaft 62 as diagrammed in FIG. 3.

In the third embodiment described in the foregoing, however, although no mention was made of any problem with the airtight vessel provided inside the vacuum chamber 21, when the interior of the airtight vessel 35 is put at atmospheric pressure, and the airtight vessel 35 is sectioned off from the outside as conventionally, if the airtightness of the airtight vessel 35 fails, the atmosphere in the airtight vessel 35 flows into the vacuum chamber 21, whereupon the interior of the airtight vessel 35 becomes a vacuum, so that the drive unit 34 which is not designed for operation in a vacuum will be damaged, which constitutes a problem. That being so, in a fourth embodiment, that problem is resolved by having the interior of the airtight vessel 35 communicate with the outside. This is described specifically using FIG. 4.

The airtight vessel 35 is deployed inside the vacuum chamber 21 where glass substrates, semiconductor wafers, or other treatment objects 24 are handled. On the outside of the airtight vessel 35 is attached the conveyor arm 33 that is turned, extended, and retracted by the drive, while on the inside is attached the drive unit 34 comprising the motor for driving the conveyor arm 33, etc.

The elevator mechanism 30 that raises and lowers the airtight vessel 35 and raises and lowers the entire treatment object conveyor robot 32 is positioned outside the vacuum chamber 21 where the treatment object 24 is handled. As noted earlier, this elevator mechanism 30 comprises the motor 20, elevator attachment bases 25 and 26, guide shaft, threaded shaft 28, elevator pedestal 29, and support member 41.

The shaft 42 that transmits the movement of the elevator mechanism 30 to the airtight vessel 35 inside the vacuum chamber 21 has its lower end linked in an airtight manner to the support member 41 of the elevator pedestal 29, is passed in an airtight manner into the interior of the vacuum chamber 21 at the bottom thereof, and has its upper end linked in an airtight manner to the airtight vessel 35. The airtightness between the airtight vessel 35 and the shaft 42 is secured by an O ring 44 or welding, etc. In order to maintain the airtightness of the vacuum chamber 21 while the shaft 42 is advancing and retracting, a pressure-resistant bellows 43 is deployed so as to surround the shaft 42. The starting end side of the bellows is secured to the vacuum chamber 21 through an O ring 44, and the terminal end side of the bellows is secured to the support member 41 of the elevator pedestal 29 through another O ring 44.

The shaft 42 has a hollow structure. Through the hollow interior 45 thereof, the airtight vessel 35 is made to communicate with the outside of the vacuum chamber 21, so that the interior of the airtight vessel 35 is always open to the outside atmosphere. Through the hollow shaft 42 are passed multiple electrical wires 48, including sensor lines, which are necessary for controlling the treatment object conveyor robot 32, from the outside of the vacuum chamber 21 to the drive unit 34 accommodated inside the airtight vessel 35, thus securing control of the robot.

Because the airtight vessel 35 is opened in this manner to the outside through the shaft 42, in a configuration wherein the drive unit 34 inside the airtight vessel 35 is always exposed to the outside atmosphere, the drive unit 34 will not be damaged even if the airtightness of the airtight vessel 35 fails, whereupon the drive unit 34 need not be designed for operation in a vacuum. Accordingly, the treatment object conveyor robot 32 deployed inside the vacuum chamber 21 can be operated stably. Also, with the shaft 42 given a hollow structure, the electrical wiring 48 needed for controlling the treatment object conveyor robot 32 can be run through the shaft 42, wherefore there is no need to provide separate airtight wiring access ports in the vacuum chamber 21, and the structure of the vacuum chamber 21 can be simplified. Also, the hollow portion 45 of the shaft 42 is used to configure a venting channel so that the airtight vessel 35 can communicate with the outside, wherefore it is not necessary to separately provide materials for securing this venting channel, so that configurational simplicity can be effected.

Furthermore, the drive unit 34 for driving the treatment object conveyor robot 32, which constitutes a source of dust, is deployed in an airtight manner, covered by the airtight vessel 35 inside the vacuum chamber 21, wherefore, unlike the case where the drive unit 34 is deployed so that it is completely exposed inside the vacuum chamber 21, penetration of dust from the drive unit 34, which constitutes a dust source, into the interior of the vacuum chamber 21 can be blocked, cleanness can be enhanced, and the reliability of the conveyor apparatus can be improved. In addition, because there is no need to provide space inside the vacuum chamber 21 for the elevator mechanism, the vacuum chamber 21 can be made smaller, and the cost of the vacuum chamber 21 reduced.

Figure 5:
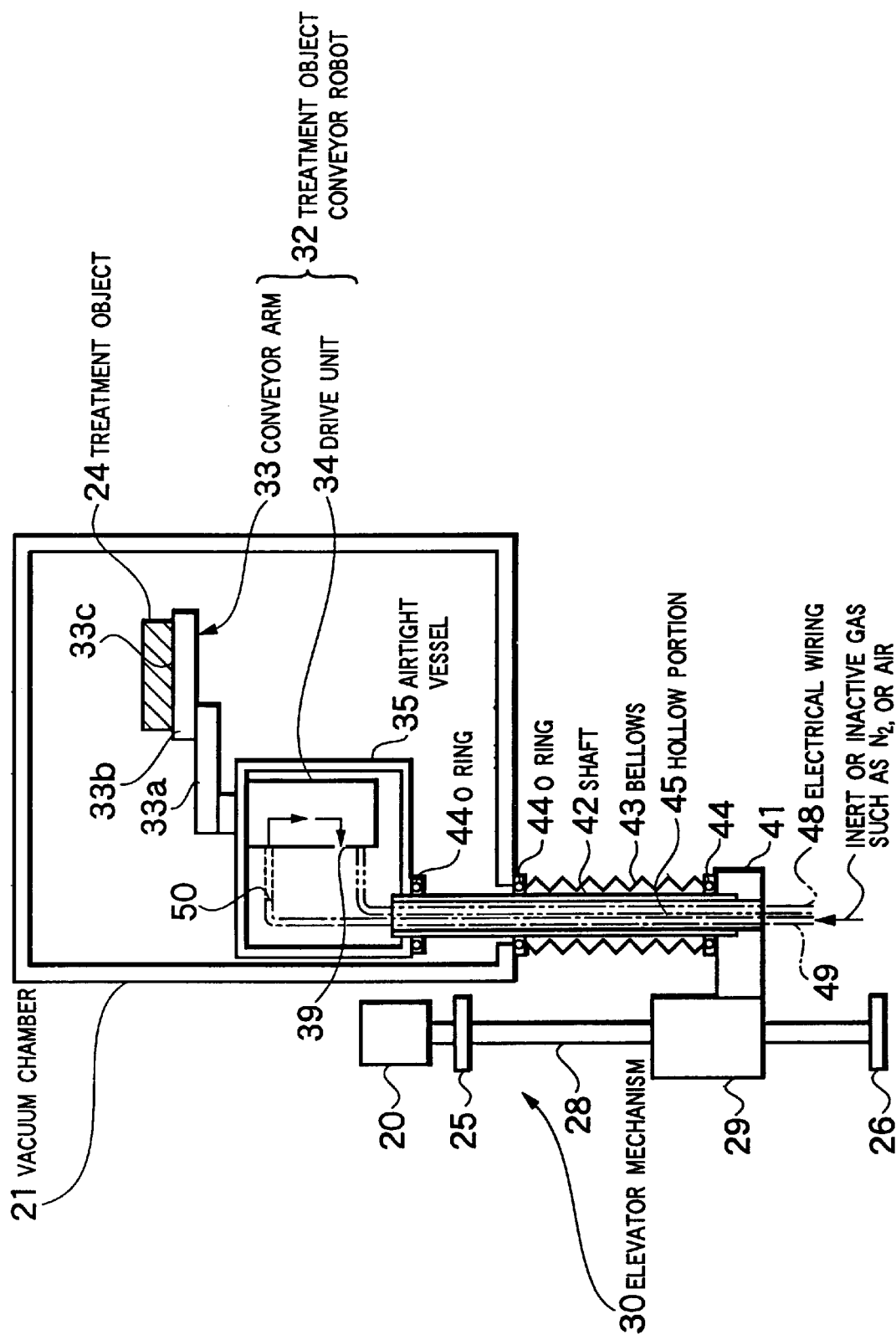
FIG. 5 is a simplified configurational diagram of the cooling structure of a drive unit in the treatment object conveyor apparatus according to the fourth embodiment.

The cooling structure for the drive unit 34 is now described using FIG. 5. Here, not only does the airtight vessel 35 that accommodates the drive unit 34 communicate with the outside air, but either an inert or inactive gas like nitrogen, helium, or argon, or air, or a gas mixture thereof is supplied to the interior of the airtight vessel 35 and exhausted from the airtight vessel 35. A gas supply line 49 for supplying gas is passed through the hollow portion 45 of the shaft 42, and led into the airtight vessel 35, a gas supply port 50 is provided in the space inside the airtight vessel 35 to provide an opening therefor, and gas is supplied to the interior of the airtight vessel 35. Alternatively, the gas supply line 49 is extended all the way to the drive unit 34 and connected to the drive unit 34, a gas supply hole is provided in the space inside the drive unit 34, and gas is supplied directly to the interior of the drive unit 34. When the gas supply line 49 is connected to the drive unit 34, a venting hole 39 is provided in the drive unit 34 for exhausting the gas supplied to the drive unit 34 to the outside of the drive unit 34. The exhausting of the gas supplied into the airtight vessel 35 is facilitated by the remaining gap portion of the hollow portion 45 excluding the portion occupied by the gas supply line 49. The supply/exhaust channel in the present invention is configured by the gas supply line 49 described here and the remaining gap portion of the hollow portion 45.

When gas is supplied to the airtight vessel 35, as compared to when the airtight vessel 35 is simply allowed to communicate with the outside air, the motor, etc., of the drive unit 34 for the treatment object conveyor robot 32 accommodated inside the airtight vessel 35 can be more effectively cooled. In this case, when gas is supplied all the way into the drive unit 34, as compared to when the gas supply stops after entering the airtight vessel 35, the drive unit 34 can be more effectively cooled, and the useful life of the drive unit 34 can be extended even further. Also, contaminants generated by the drive unit 34 can be eliminated, wherefore, even if the airtightness of the airtight vessel 35 should fail, the quantity of contamination entering the chamber 21 can be reduced. In this case, furthermore, the exhaust may be released directly into the outside air, or it may be conducted to an exhaust gas treatment system or the like in the factory.

Figure 6:
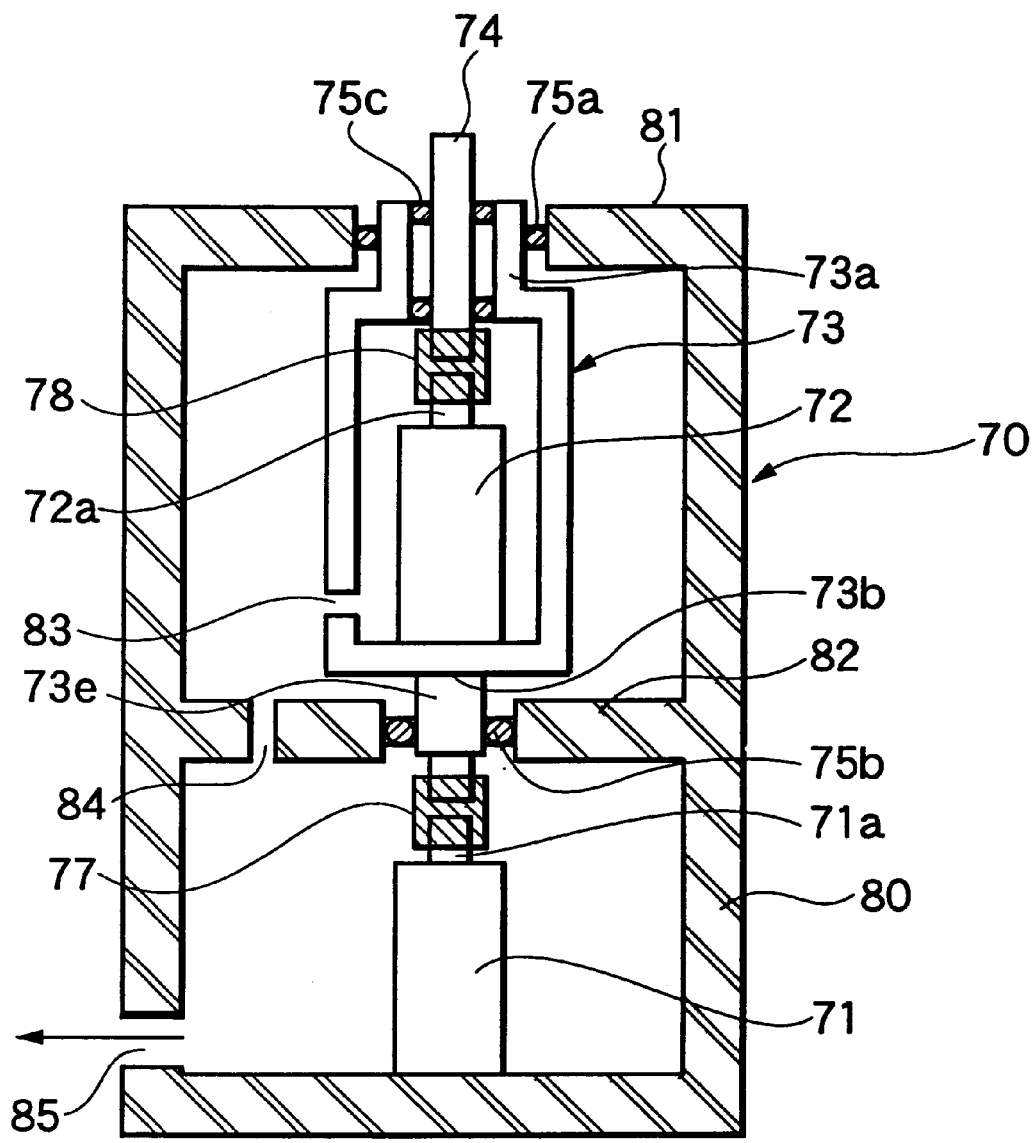
FIG. 6 is a cross-sectional view of the specific structure of the drive unit according to the fourth embodiment.

Up to this point, no detailed description has been given of the drive unit 34 that drives the treatment object conveyor robot 32. Such a detailed description is now given, taking as an example the double-shafted turning drive apparatus diagrammed in FIG. 6.

A double-shafted turning drive apparatus 70 mainly comprises two motors 71 and 72, and one container 80 that separately houses the two motors 71 and 72. In order to allow the two motors 71 and 72 to communicate with the outside air, venting holes 83, 84, and 85 are provided, respectively, to the outer wall of a cylindrical first turning output shaft 73 that covers one motor 72, to an inner wall 82 that partitions the interior of the container 80 into two compartments for separately accommodating the two motors 71 and 72, and to the outer wall of the container 80 in that portion where the other motor 71 is accommodated. The container 80 that accommodates the motors 71 and 72 may also be directly configured by the airtight vessel 35 diagrammed in FIG. 4.

Both the first drive motor 71 and the second drive motor 72 are configured by general-purpose motors. A first turning output shaft 73 is coaxially attached via a coupling 77 to the motor turning shaft 71a of the first drive motor 71. The first turning output shaft 73 is formed so as to be hollow, the back part 73b in the axial direction near the first drive motor 71 is closed, and the front part 73a far from the motor 71 side is opened, in a cylindrical shape. In the first turning output shaft 73, the forward part 73a formed with a smaller diameter than the middle part and a projecting shaft 73e in the back part 73b, respectively, are supported so that they can turn freely, by the inner wall 82, via turning-load-holding bearings 75a and 75b.

The second drive motor 72 noted above is integrally attached inside the hollow cylindrical first turning output shaft 73 so that the motor turning shaft 72a thereof is formed coaxially with the first turning output shaft 73. To the motor turning shaft 72a of this second drive motor 72 is coaxially attached the second turning output shaft 74, via a coupling 78. This second turning output shaft 74 is positioned coaxially with the first turning output shaft 73 so that it protrudes in the axial direction from the open front part 73a of the hollow cylindrical first turning output shaft 73. The second turning output shaft 74 is supported so that it can turn freely by the inner wall of the open front part 73a via a bearing 75c.

In the configuration described above, when the second drive motor 72 is stopped and held and the first drive motor 71 is driven, the hollow cylindrical first turning output shaft 73 turns. The second drive motor 72 is attached integrally inside the hollow cylindrical first turning output shaft 73, wherefore the second turning motor 72 itself turns in conjunction with the turning of the first turning output shaft 73. For this reason, the internal second turning output shaft 74 attached to the motor turning shaft 72a of the second turning motor 72 also turns. Thus, by driving only the first turning motor 71 in this manner, the second turning output shaft 74 can be synchronously turned with the first turning output shaft 73.

Also, when the second turning motor 72 is driven and the first turning motor 71 is stopped and held, the external first turning output shaft 73 does not turn, and only the second turning output shaft 74 therein turns. Accordingly, the turning of the second turning output shaft 74 only can be secured.

Next, referring also to FIG. 5, the action of the conveyor arm 33 when the double-shafted turning drive apparatus 70 described in the foregoing is adopted as the drive unit 34 for the treatment object conveyor robot 32 is described.

(1) Stopping and holding the first drive motor 71 while driving the second turning motor 72:

When the second turning motor 72 drives and the turning output shaft 74 thereof is turned counterclockwise, the first arm 33a in FIG. 5 also turns counterclockwise, and, in conjunction with this turning, the second arm 33b turns clockwise. The treatment object carrier unit 33c is turned counterclockwise by the turning of the second arm 33b relative to the first arm 33a. As a result, the conveyor arm 33 conveys the treatment object 24 linearly in one direction.

(2) Stopping and holding the second turning motor 72 while driving the first turning motor 71:

When the first turning output shaft 73 is turned by the first turning motor 71, the second turning motor 72 held therein also turns together therewith. As a consequence, the conveyor arm 33 conveys the treatment object 24 in a turning motion in an attitude holding state with the first arm 33a and second arm 33b superimposed.

Thus, when the first turning motor 71 is stopped and held while the second turning motor 72 is driving, conveyance in one direction can be performed. If the second turning motor 72 is merely stopped and held, and a condition is brought about whereby only the first turning motor 71 drives, the treatment object 24 can be conveyed in a turning movement with the conveyor arm 33 in an attitude holding condition, without synchronizing the two drive motors.

Figure 4:
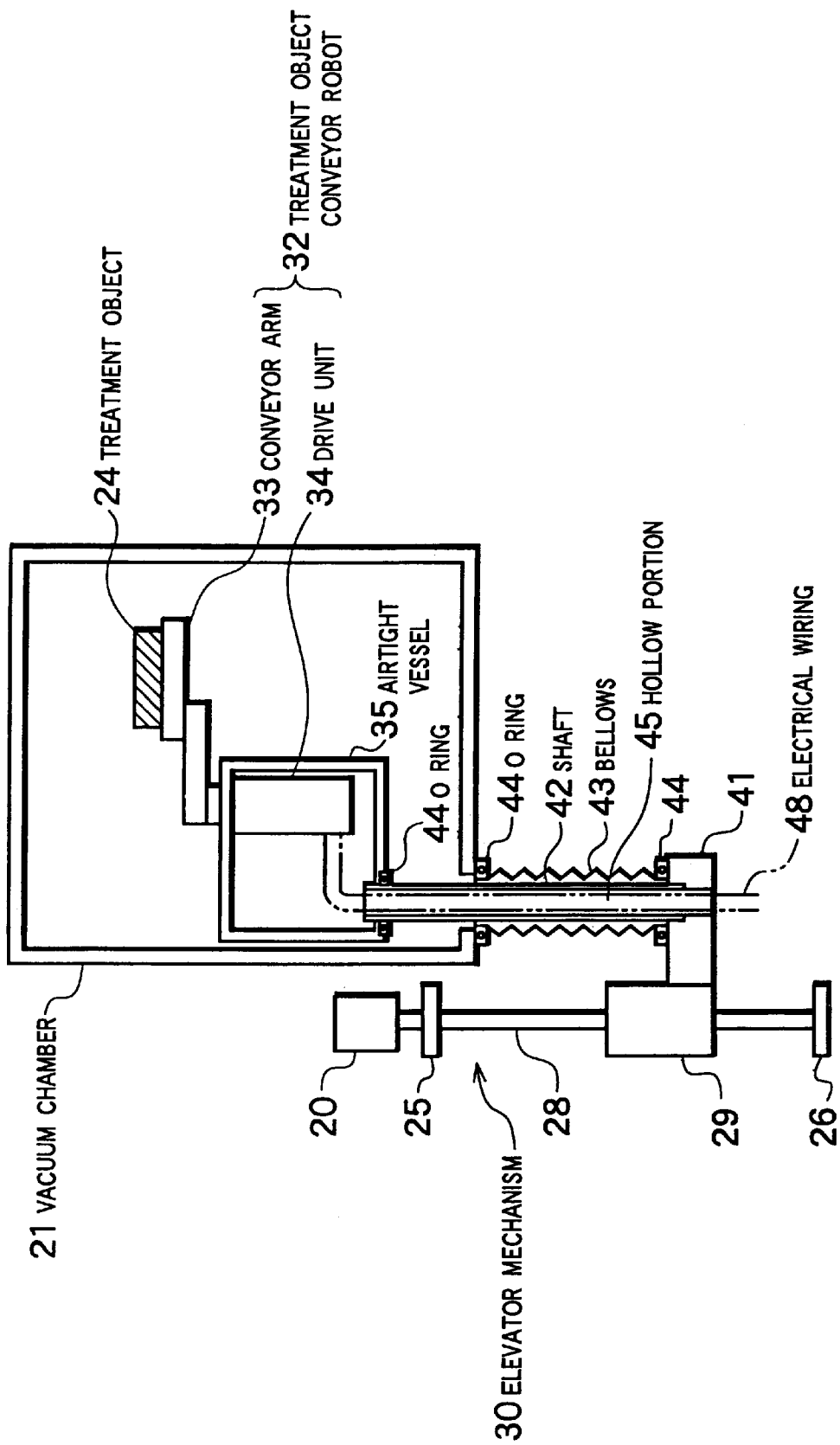
FIG. 4 is a simplified configurational diagram of a treatment object conveyor apparatus according to a fourth embodiment.

In the configuration diagrammed in FIG. 4, however, the bellows 43 is positioned outside the vacuum chamber 21. When such a configuration as this is implemented, and the interior of the vacuum chamber 21 is used in a vacuum state, the inside of the bellows 43 will become a vacuum, but, due to its structure, the bellows will not be readily deformed. Accordingly, it is preferable that the bellows 43 be positioned outside the vacuum chamber 21. On the other hand, however, it is also possible, in principle, to deploy the bellows 43 inside the vacuum chamber 21. In that case, the bellows would be deployed so as to surround that portion of the shaft 42 which penetrates into the interior of the vacuum chamber 21, and the two bellows ends would be connected in an airtight manner to the airtight vessel 35 and to the vacuum chamber 21. When the bellows 43 is positioned inside the vacuum chamber 21 in this manner, and the interior of the vacuum chamber 21 is used in a vacuum state, a vacuum will exist outside the bellows 43, wherefore the bellows will be readily deformed due to its structure, and its strength cannot be preserved. In order to preserve its strength, reinforcement would be necessary, such as deploying guide rails along the direction of the extension and contraction of the bellows 43. As a result, the number of parts would become greater, and manufacturing costs would become high. Accordingly, it is not desirable to deploy the bellows 43 inside the vacuum chamber 21.

In the first to fourth embodiments described in the foregoing, the elevator pedestal 29 is raised and lowered by a motor 20 and threaded shaft 28. This may be anything, however, so long as the configuration permits linear drive. The configuration may employ any of various cylinders or linear motors, for example.

Figure 7:
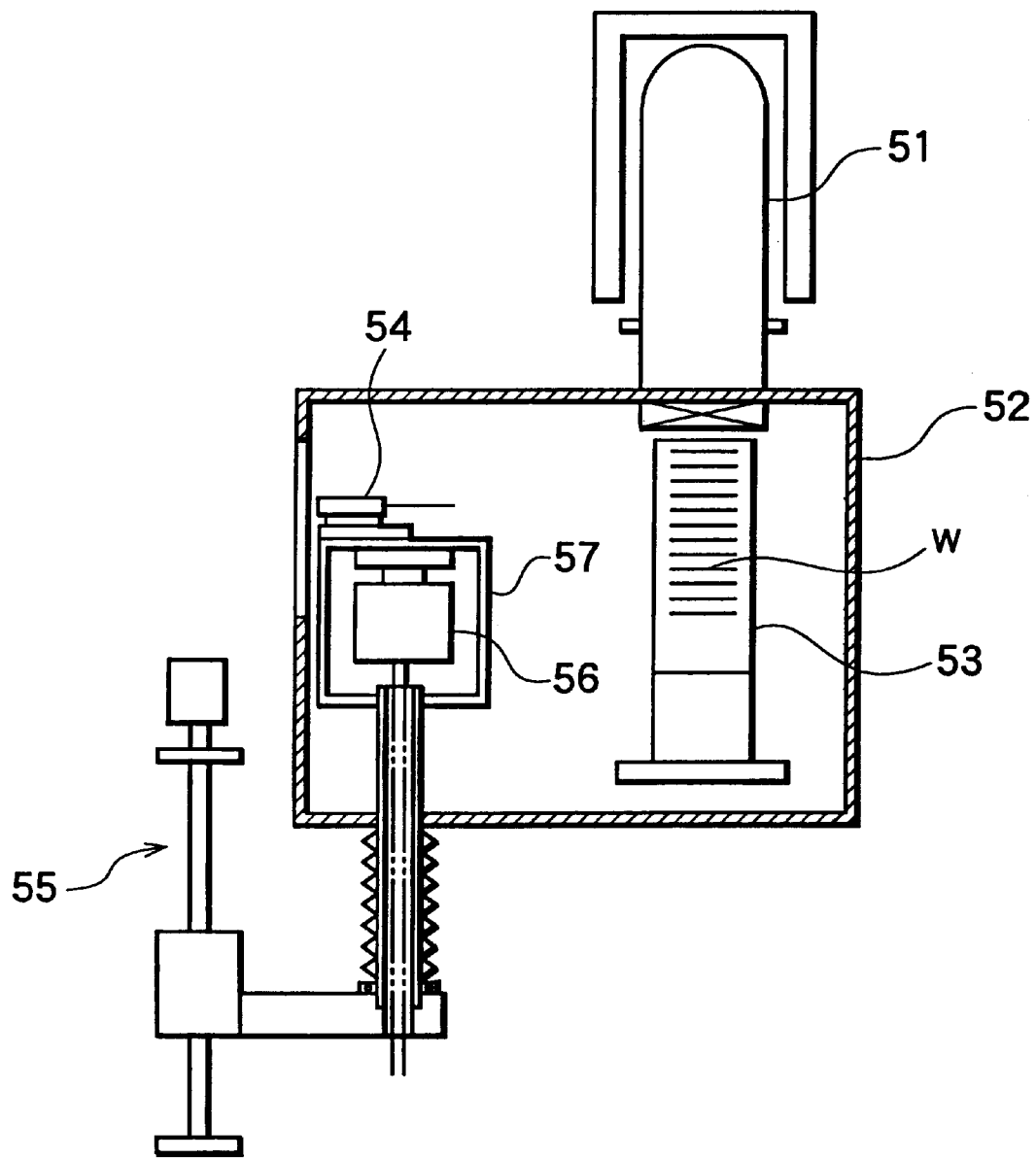
FIG. 7 is a simplified configurational diagram of a semiconductor manufacturing apparatus that is equipped with an embodied treatment object conveyor apparatus.
Figure 8A:
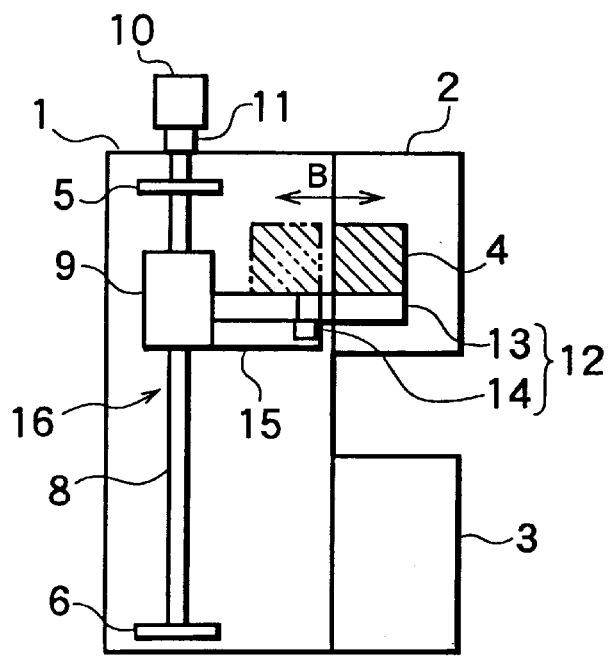
FIG. 8A–FIG. 8D are a set of simplified configurational diagrams of a conventional treatment object conveyor apparatus, with FIG. 8A being a front elevation thereof when the treatment object is moved from the vacuum chamber to the upper connecting chamber, (b) being a side elevation of FIG. 8A, FIG. 8C being a front elevation thereof when the treatment object is raised or lowered inside the vacuum chamber, and FIG. 8D being a front elevation thereof when the treatment object is moved from the vacuum chamber to the lower connecting chamber.
Figure 8B:
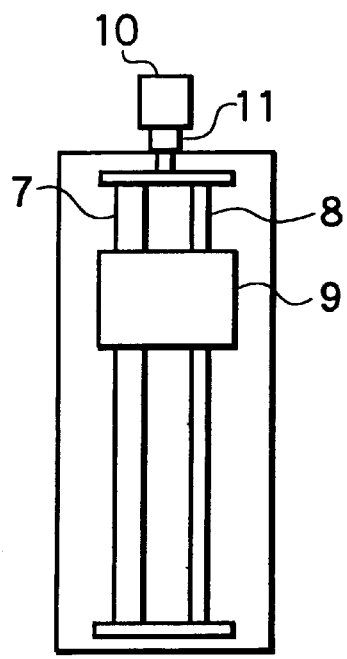
Figure 8C:
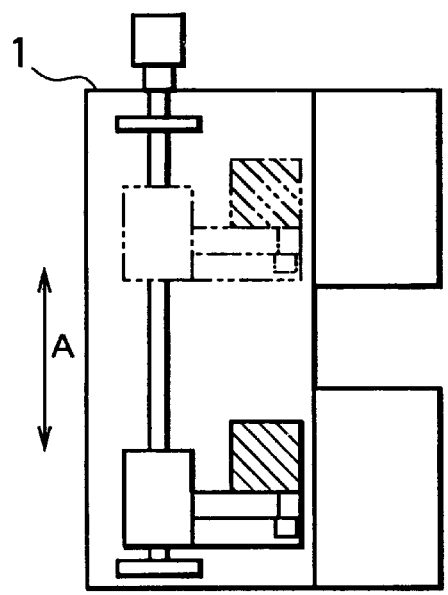
Figure 8D:
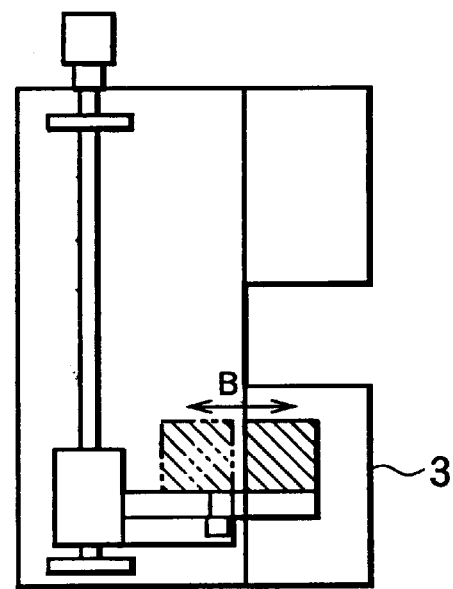

It is also possible to configure a semiconductor manufacturing apparatus such as is diagrammed in FIG. 7 using the treatment object conveyor apparatus described in the foregoing. In this semiconductor manufacturing apparatus, a load locking chamber 52 is deployed as a vacuum chamber below an upright reaction chamber 51, and, in the interior of the load locking chamber 52, a boat 53 is inserted into and withdrawn from the upright reaction chamber 51 as wafer carrier means for holding wafers W stacked in multiple stages below the upright reaction chamber 51. Inside the load locking chamber 52, a wafer transporter 54 is deployed as a treatment object conveyor robot for transporting the wafers W. This wafer transporter 54 carries the wafers W by performing complex movements by means of the elevator mechanism 55 deployed outside the load locking chamber 52 and a drive unit 56 that is housed inside an airtight vessel 57 that communicates with the outside and is maintained at atmospheric pressure.

The operation is now described. By the concerted movements of the wafer drive unit 56 and the elevator mechanism 55, the wafer transporter 54 by which the wafers are held is aligned at the height position for wafer insertion into the boat 53. The drive unit 56 of the wafer transporter 54 is driven so that a conveyor arm extends toward the boat 53, and the wafer is conveyed to the carrying position in the boat 53. The wafer transporter 54 is lowered with the elevator mechanism 55 by lowering the shaft a certain amount, and the wafer W is transferred to the wafer carrier unit of the boat 53 from the wafer transporter 54. The drive unit 56 of the wafer transporter 54 is driven to contract the conveyor arm and return it to its original position. The drive unit 56 and the elevator mechanism 55 again work in concert to mote the wafer transporter 54, and a wafer is extracted from a cassette (not shown) in which wafers are stacked and stored, adjacent to the load locking chamber 52.

In order to extract a wafer from the cassette, the drive unit 56 and the elevator mechanism 55 work in concert to align the wafer transporter 54 at the cassette wafer extraction height. The drive unit 56 is driven, and the conveyor arm of the wafer transporter 54 is extended and inserted below a wafer. By raising the shaft a certain amount by the elevator mechanism 55, the wafer transporter 54 is raised, and the wafer is transferred from the cassette on the conveyor arm. After this transfer, the conveyor arm of the wafer transporter 54 is contracted and returned to its original position.

By repeating the operation described in the foregoing, the desired number of wafers W are loaded into the boat 53. After loading, the boat 53 is raised by a boat elevator (not shown) and inserted inside the reaction chamber 5, whereupon the wafers W are subjected to a prescribed substrate treatment inside the reaction chamber 51. Such treatment may include processing by a CVD method, processing to diffuse impurities, annealing processes, processing by a plasma CVD method, etching processes, ashing processes, or sputtering processes, etc. When the prescribed substrate treatment on the wafers W has been completed, the wafers W are conveyed out by a procedure that is the reverse of that of loading wafers into the boat 53, as described above. Thus, if a semiconductor manufacturing apparatus is configured as diagrammed in FIG. 7 using a treatment object conveyor apparatus, it becomes possible to build more highly reliable apparatuses.

In the embodiment described in the foregoing, the wafer carrier means comprise a boat 53 for carrying a plurality of wafers. The wafer carrier means, however, need not carry a plurality of wafers, but may carry only one wafer (single-wafer holding type). In the embodiment described in the foregoing, moreover, a boat is employed which is inserted inside the reaction chamber 51 after substrates have been loaded into the boat. However, the wafer carrier means such as the boat etc. may be permanently installed inside the reaction chamber 51, a gate valve provided at the side of the reaction chamber 51, and wafers W directly loaded into the reaction chamber 51 through the gate valve.

Moreover, the connecting chambers 22 and 23 described in the foregoing embodiments may be cassette chambers that accommodate cassette shelves, or they may be load locking chambers as described above. Nor do the chambers need to be limited to a vacuum state, but any atmosphere may be effected therein, and cases where $N_2$ replacement is performed are also permissible.

Furthermore, the pressure inside the chamber may be atmospheric pressure, in which case also the interior of the chamber will not be contaminated by dust produced by the drive unit. And, because the airtight vessel that accommodates the drive unit in an airtight fashion communicates with the outside air, the drive unit can be cooled. In addition, if an inert or inactive gas or the like is supplied into the airtight vessel, the effectiveness of cooling the drive unit can be enhanced.

As based on the present invention, the drive unit is accommodated in an airtight vessel, whereby the drive unit is removed from the atmosphere inside the chamber, so that the treatment object conveyor means deployed inside the chamber can be operated stably. Also, the airtight vessel in which the drive unit is accommodated communicates with the outside of the chamber, wherefore, irrespective of the atmosphere present inside the chamber, the outside atmosphere can be introduced into the airtight vessel, and the drive unit can be designed for operation at the pressure of the outside atmosphere. Moreover, because the elevator mechanism is deployed outside the chamber, the generation of dust inside the chamber is reduced, and the chamber can be made smaller. Especially in cases where the chamber is in a vacuum state, as compared to cases where the drive unit of the treatment object conveyor means is accommodated completely exposed inside the chamber, there is no need to design the drive unit for operation in a vacuum, and it can instead be designed for operation at atmospheric pressure, wherefore the apparatus can be given an inexpensive configuration.

What is claimed is:

1. A treatment object conveyor apparatus comprising:

a chamber;

treatment object conveyor means deployed inside said chamber, having a conveyor unit and a drive unit for driving said conveyor unit, for driving said conveyor unit with said drive unit and conveying treatment object carried by said conveyor unit;

an airtight vessel for housing said drive unit of said treatment object conveyor means in an airtight condition inside said chamber;

a shaft that penetrates in an airtight way into said chamber from outside said chamber, is linked with said airtight vessel, and advances and retracts said airtight vessel relatively to said chamber to move entirety of said treatment object conveyor;

a movement mechanism for advancing and retracting said shaft; and a venting channel provided in said shaft that effects outside atmosphere inside said airtight vessel by causing said airtight vessel to communicate with outside of said chamber.

2. The treatment object conveyor apparatus according to claim 1, wherein said venting channel comprises a supply/exhaust channel for supplying and exhausting an inert or inactive gas, atmospheric air, or a mixture of such gases from outside said chamber to and from said airtight vessel.

3. The treatment object conveyor apparatus according to claim 2, wherein electrical wiring is passed to said drive unit accommodated inside said airtight vessel from outside said chamber through said venting channel.

4. The treatment object conveyor apparatus according to claim 1, wherein said shaft is covered by a bellows, starting end of said bellows is secured to said chamber by a seal, terminal end of said bellows is secured to said movement mechanism by a seal, and said chamber into which said shaft is inserted is made an airtight structure.

5. The treatment object conveyor apparatus according to claim 1, wherein said treatment object is a semiconductor wafer, a glass substrate, or a cassette for accommodating such.

6. The treatment object conveyor apparatus according to claim 1, wherein interior of said chamber is rendered a vacuum.

7. The treatment object conveyor apparatus according to claim 1, wherein interior of said chamber at atmospheric pressure.

8. A semiconductor manufacturing apparatus, comprising: a treatment object conveyor apparatus comprising:

a chamber;

a treatment object conveyor deployed inside said chamber, having a conveyor unit and a drive unit for driving said conveyor unit, driving said conveyor unit with said drive unit and conveying treatment object carried by said conveyor unit;

an airtight vessel for housing said drive unit of said treatment object conveyor in an airtight condition inside said chamber;

a shaft that penetrates in an airtight way into said chamber from outside said chamber, is linked with said airtight vessel, and advances and retracts said airtight vessel relatively to said chamber to move the entirety of said treatment object conveyor;

a movement mechanism for advancing and retracting said shaft; and a venting channel provided in said shaft that effects outside atmosphere inside said airtight vessel by causing said airtight vessel to communicate with outside of said chamber.

9. A treatment object treatment method for conveying an object for treatment using a semi-conductor apparatus comprising a chamber; a treatment sub-chamber in which objects are treated that is linked in an airtight manner to said chamber; a treatment object conveyor, deployed inside said chamber, comprising an arm unit and a drive unit for driving said arm unit, and which conveys the treatment object carried by said arm unit; an airtight vessel accommodating said drive unit of said treatment object conveyor in an airtight manner inside said chamber; a venting channel that allows said airtight vessel to communicate with the atmosphere outside of said chamber; a shaft that penetrates in an airtight manner into said chamber form outside said chamber, is linked with said airtight vessel, and advances and retracts said airtight vessel relatively with said chamber to move said treatment object conveyor inside said chamber; and, a treatment object carrier unit inside said subchamber; comprising:

introducing outside atmosphere to said airtight vessel through said venting channel;

operating said shaft to advance and retract said treatment object conveyor to positions corresponding to said treatment subchamber inside said chamber, moving said arm unit of said treatment object conveyor, after said treatment object conveyor has been moved, by said drive unit accommodated inside said airtight vessel, and moving said treatment object carried by said arm unit by conveying said treatment object from said chamber to said treatment subchamber;

loading said treatment object conveyed to said treatment subchamber on a treatment object carrier unit inside said treatment subchamber, and performing a prescribed treatment on said treatment object loaded on said treatment object carrier unit.

* * * * *

UNITED STATES PATENT AND TRADEMARK OFFICE
CERTIFICATE OF CORRECTION

PATENT NO. : 6,190,104 B1 Page 1 of 1
DATED : February 20, 2001
INVENTOR(S) : Kazuhito Ikeda et al.

It is certified that error appears in the above-identified patent and that said Letters Patent is hereby corrected as shown below:

Claim 1,
Line 3, delete "means" and
Line 9, delete "means".

Claim 7,
Line 2, after "chamber" insert -- is put --.

Signed and Sealed this

Eighth Day of January, 2002

Attest:

Attesting Officer

JAMES E. ROGAN
*Director of the United States Patent and Trademark Office*